(12) United States Patent
Hiner et al.

(10) Patent No.: US 7,399,661 B2
(45) Date of Patent: Jul. 15, 2008

(54) METHOD FOR MAKING AN INTEGRATED CIRCUIT SUBSTRATE HAVING EMBEDDED BACK-SIDE ACCESS CONDUCTORS AND VIAS

(75) Inventors: David Jon Hiner, Chandler, AZ (US);
Ronald Patrick Huemoeller, Chandler, AZ (US); Sukianto Rusli, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 374 days.

(21) Appl. No.: 10/947,124

(22) Filed: Sep. 22, 2004

(65) Prior Publication Data
US 2005/0041398 A1      Feb. 24, 2005

Related U.S. Application Data

(60) Division of application No. 10/392,737, filed on Mar. 19, 2003, now abandoned, which is a continuation-in-part of application No. 10/261,868, filed on Oct. 1, 2002, now abandoned, and a continuation-in-part of application No. 10/138,225, filed on May 1, 2002, now Pat. No. 6,930,256.

(51) Int. Cl.
*H01L 21/00*      (2006.01)
*H01L 23/04*      (2006.01)
*H05K 1/11*      (2006.01)

(52) U.S. Cl. .................. 438/118; 438/667; 174/262; 257/698; 257/774

(58) Field of Classification Search .............. None
See application file for complete search history.

(56) References Cited

U.S. PATENT DOCUMENTS 3,324,014 A   6/1967   Modjeska ............. 205/122

(Continued)

FOREIGN PATENT DOCUMENTS

JP         05-109975         4/1993

(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner*—Alonzo Chambliss
(74) *Attorney, Agent, or Firm*—Gunnison, McKay & Hodgson, L.L.P.; Serge J. Hodgson

(57) ABSTRACT

A method for making an integrated circuit substrate having embedded back-side access conductors and vias provides a high-density mounting and interconnect structure for integrated circuits that is compatible with etched, plated or printed pre-manufactured substrate components. A circuit board or film having a pre-plated, etched or printed circuit, for example a rigid substrate having a Ball Grid Array (BGA) ball-attach pattern, is laser perforated to produce blind vias and/or conductive patterns that provide contact through to conductors of the prefabricated circuit board or film. Existing circuit board and substrate technology is thereby made compatible with laser-embedding technologies, providing the low-cost advantages of existing etching, plating and printing technologies along with a high conductor density associated with laser-embedded circuit technologies.

20 Claims, 4 Drawing Sheets

U.S. PATENT DOCUMENTS

| | | | |
|---|---|---|---|
| 3,868,724 A | 2/1975 | Perrino | 257/668 |
| 3,916,434 A | 10/1975 | Garboushian | 257/704 |
| 4,322,778 A | 3/1982 | Barbour et al. | |
| 4,508,754 A * | 4/1985 | Stepan | 427/555 |
| 4,532,152 A | 7/1985 | Elarde | 427/96 |
| 4,532,419 A | 7/1985 | Takeda | 235/492 |
| 4,604,799 A | 8/1986 | Gurol | 29/847 |
| 4,642,160 A | 2/1987 | Burgess | |
| 4,685,033 A | 8/1987 | Inone | |
| 4,706,167 A | 11/1987 | Sullivan | 361/406 |
| 4,716,049 A | 12/1987 | Patraw | 427/96 |
| 4,786,952 A | 11/1988 | MacIver et al. | 257/260 |
| 4,811,082 A | 3/1989 | Jacobs et al. | |
| 4,897,338 A | 1/1990 | Spicciati et al. | |
| 4,905,124 A | 2/1990 | Banjo et al. | 361/395 |
| 4,915,983 A | 4/1990 | Lake et al. | 430/314 |
| 4,964,212 A * | 10/1990 | Deroux-Dauphin et al. | 29/852 |
| 4,974,120 A | 11/1990 | Kodai et al. | 361/392 |
| 4,996,391 A | 2/1991 | Schmidt | 174/255 |
| 5,021,047 A | 6/1991 | Movern | |
| 5,053,357 A * | 10/1991 | Lin et al. | 29/593 |
| 5,072,075 A | 12/1991 | Lee et al. | |
| 5,081,520 A | 1/1992 | Yoshii et al. | 257/702 |
| 5,108,553 A * | 4/1992 | Foster et al. | 205/125 |
| 5,110,664 A | 5/1992 | Nakanishi et al. | 428/195 |
| 5,191,174 A | 3/1993 | Chang et al. | |
| 5,229,550 A | 7/1993 | Birdra et al. | |
| 5,239,448 A * | 8/1993 | Perkins et al. | 361/764 |
| 5,247,429 A | 9/1993 | Iwase et al. | 362/29 |
| 5,263,243 A | 11/1993 | Taneda et al. | 29/830 |
| 5,283,459 A | 2/1994 | Hirano et al. | 257/419 |
| 5,371,654 A | 12/1994 | Beaman et al. | 361/744 |
| 5,379,191 A | 1/1995 | Carey et al. | 361/777 |
| 5,404,044 A | 4/1995 | Booth et al. | |
| 5,440,805 A | 8/1995 | Daigle et al. | 29/830 |
| 5,463,253 A | 10/1995 | Waki et al. | 257/724 |
| 5,474,957 A | 12/1995 | Urushima | 437/209 |
| 5,474,958 A | 12/1995 | Djennas et al. | 437/211 |
| 5,508,938 A | 4/1996 | Wheeler | |
| 5,530,288 A | 6/1996 | Stone | 257/700 |
| 5,531,020 A | 7/1996 | Durand et al. | 29/840 |
| 5,574,309 A | 11/1996 | Papapietro et al. | 257/679 |
| 5,581,498 A | 12/1996 | Ludwig et al. | 365/63 |
| 5,582,858 A | 12/1996 | Adamopoulos et al. | 427/96 |
| 5,616,422 A * | 4/1997 | Ballard et al. | 428/621 |
| 5,637,832 A | 6/1997 | Danner | 174/260 |
| 5,674,785 A | 10/1997 | Akram et al. | 437/217 |
| 5,719,749 A | 2/1998 | Stopperan | 361/749 |
| 5,739,579 A | 4/1998 | Chiang et al. | 257/635 |
| 5,739,581 A | 4/1998 | Chillara | 257/668 |
| 5,739,585 A | 4/1998 | Akram et al. | 257/698 |
| 5,739,588 A | 4/1998 | Ishida et al. | 257/782 |
| 5,742,479 A | 4/1998 | Asakura | 361/737 |
| 5,774,340 A | 6/1998 | Chang et al. | |
| 5,784,259 A | 7/1998 | Asakura | 361/752 |
| 5,798,014 A | 8/1998 | Weber | 156/263 |
| 5,822,190 A | 10/1998 | Iwasaki | 361/737 |
| 5,826,330 A | 10/1998 | Isoda et al. | 29/852 |
| 5,835,355 A | 11/1998 | Dordi | 361/760 |
| 5,847,453 A | 12/1998 | Uematsu et al. | |
| 5,894,108 A | 4/1999 | Mostafazadeh et al. | 174/52.4 |
| 5,903,052 A | 5/1999 | Chen et al. | 257/706 |
| 5,936,843 A | 8/1999 | Ohshima et al. | 361/760 |
| 5,952,611 A | 9/1999 | Eng et al. | 174/52.4 |
| 5,990,546 A | 11/1999 | Igarashi et al. | 257/700 |
| 6,004,619 A | 12/1999 | Dippon et al. | 427/97 |
| 6,013,948 A | 1/2000 | Akram et al. | 257/698 |
| 6,021,564 A | 2/2000 | Hanson | 29/852 |
| 6,028,364 A | 2/2000 | Ogino et al. | 257/778 |
| 6,034,427 A | 3/2000 | Lan et al. | 257/698 |
| 6,040,622 A | 3/2000 | Wallace | 257/679 |
| 6,060,778 A | 5/2000 | Jeong et al. | 257/710 |
| 6,069,407 A | 5/2000 | Hamzehdoost | 257/774 |
| 6,072,243 A | 6/2000 | Nakanishi | 257/783 |
| 6,081,036 A | 6/2000 | Hirano et al. | |
| 6,115,910 A | 9/2000 | Ghahghahi | 29/833 |
| 6,119,338 A | 9/2000 | Wang et al. | 29/852 |
| 6,122,171 A | 9/2000 | Akram et al. | 361/704 |
| 6,127,250 A | 10/2000 | Sylvester et al. | 438/584 |
| 6,127,833 A | 10/2000 | Wu et al. | 324/755 |
| 6,160,705 A | 12/2000 | Stearns et al. | 361/704 |
| 6,172,419 B1 | 1/2001 | Kinsman | 257/737 |
| 6,175,087 B1 | 1/2001 | Keesler et al. | |
| 6,184,463 B1 | 2/2001 | Panchou et al. | 174/52.4 |
| 6,204,453 B1 | 3/2001 | Fallon et al. | |
| 6,214,641 B1 | 4/2001 | Akram | 438/107 |
| 6,235,554 B1 | 5/2001 | Akram et al. | 438/109 |
| 6,239,485 B1 | 5/2001 | Peters et al. | |
| D445,096 S | 7/2001 | Wallace | D14/117 |
| D446,525 S | 8/2001 | Okamoto et al. | D14/436 |
| 6,274,821 B1 | 8/2001 | Echigo et al. | 174/255 |
| 6,280,641 B1 | 8/2001 | Gaku et al. | 216/17 |
| 6,316,285 B1 | 11/2001 | Jiang et al. | 438/106 |
| 6,351,031 B1 | 2/2002 | Iijima et al. | |
| 6,352,914 B2 | 3/2002 | Ball et al. | 438/599 |
| 6,353,999 B1 | 3/2002 | Cheng | 29/852 |
| 6,365,975 B1 | 4/2002 | DiStefona et al. | |
| 6,376,906 B1 | 4/2002 | Asai et al. | |
| 6,378,201 B1 | 4/2002 | Tsukada et al. | 29/852 |
| 6,392,160 B1 | 5/2002 | Andry et al. | 174/261 |
| 6,395,578 B1 | 5/2002 | Shin et al. | 438/106 |
| 6,405,431 B1 | 6/2002 | Shin et al. | 29/852 |
| 6,406,942 B2 | 6/2002 | Honda | 438/119 |
| 6,407,341 B1 | 6/2002 | Anstrom et al. | 174/255 |
| 6,407,930 B1 | 6/2002 | Hsu | 361/784 |
| 6,418,615 B1 | 7/2002 | Rokugawa et al. | 29/852 |
| 6,426,550 B2 | 7/2002 | Ball et al. | 257/700 |
| 6,451,509 B2 | 9/2002 | Keesler et al. | 430/311 |
| 6,479,762 B2 | 11/2002 | Kusaka | 174/261 |
| 6,497,943 B1 | 12/2002 | Jimarez et al. | 428/209 |
| 6,502,774 B1 | 1/2003 | Johansson et al. | 241/37 |
| 6,517,995 B1 | 2/2003 | Jacobson et al. | 430/320 |
| 6,534,391 B1 | 3/2003 | Huemoeller et al. | 438/612 |
| 6,534,723 B1 | 3/2003 | Asai et al. | 174/255 |
| 6,544,638 B2 | 4/2003 | Fischer et al. | 428/322.7 |
| 6,570,258 B2 | 5/2003 | Ma et al. | 257/774 |
| 6,574,106 B2 | 6/2003 | Mori | 361/705 |
| 6,586,682 B2 | 7/2003 | Strandberg | 174/255 |
| 6,608,757 B1 | 8/2003 | Bhatt et al. | |
| 6,660,559 B1 | 12/2003 | Huemoeller et al. | 438/106 |
| 6,715,204 B1 | 4/2004 | Tsukada et al. | 29/847 |
| 6,727,645 B2 | 4/2004 | Tsujimura et al. | 313/504 |
| 6,730,857 B2 | 5/2004 | Konrad et al. | 174/257 |
| 6,753,612 B2 | 6/2004 | Adae-Amoakoh et al. | 257/774 |
| 6,787,443 B1 | 9/2004 | Boggs et al. | 174/262 |
| 6,803,528 B1 | 10/2004 | Koyanagi | 174/262 |
| 6,815,709 B2 | 11/2004 | Clothier et al. | |
| 6,815,739 B2 | 11/2004 | Huff et al. | 257/275 |
| 6,822,334 B2 | 11/2004 | Hori et al. | 257/775 |
| 6,891,261 B2 | 5/2005 | Awaya | 257/692 |
| 6,913,952 B2 | 7/2005 | Moxham et al. | 438/125 |
| 6,930,256 B1 * | 8/2005 | Huemoeller et al. | 174/260 |
| 6,930,257 B1 | 8/2005 | Hiner et al. | 174/262 |
| 6,940,170 B2 | 9/2005 | Parikh | 257/750 |
| 6,989,593 B2 | 1/2006 | Khan et al. | 257/707 |
| 7,028,400 B1 | 4/2006 | Hiner et al. | 29/852 |
| 7,145,238 B1 | 12/2006 | Huemoeller et al. | 257/750 |
| 2002/0017712 A1 | 2/2002 | Bessho et al. | 257/700 |
| 2003/0000738 A1 * | 1/2003 | Rumsey et al. | 174/260 |

| | | | |
|---|---|---|---|
| 2003/0128096 A1 | 7/2003 | Mazzochette | 338/22 |
| 2005/0194353 A1 | 9/2005 | Johnson et al. | 216/65 |

FOREIGN PATENT DOCUMENTS

| | | |
|---|---|---|
| JP | 05-136323 | 6/1993 |
| JP | 07-017175 | 1/1995 |
| JP | 08-190615 | 7/1996 |
| JP | 10-334205 | 12/1998 |

OTHER PUBLICATIONS

Wolf et al., "Silicon Processing for the VLSI Era: vol. 1- Process Technology", 1986, pp. 407-408.

Huemoeller et al., U.S. Appl. No. 11/045,402, filed Jan. 28, 2005, entitled "Method for Making a Semiconductor Package Substrate Having a Printed Circuit Pattern Atop and Within a Dielectric".

Hiner et al., U.S. Appl. No. 11/098,995, filed Apr. 5, 2005, entitled "Method for Making An Integrated Circuit Substrate Having Laminated Laser-Embedded Circuit Layers".

Huemoeller et al., U.S. Appl. No. 11/166,005, filed Jun. 24, 2005, entitled "Circuit-on-Foil Process for Manufacturing a Laminated Semiconductor Package Substrate Having Embedded Conductive Patterns".

Huemoeller et al., U.S. Appl. No. 11/182,985, filed Jul. 14, 2005, entitled "Semiconductor Package Having Laser-Embedded Terminals".

Huemoeller et al., U.S. Appl. No. 11/189,593, filed Jul. 26, 2005, entitled "Integral Plated Semiconductor Package Substrate Stiffener".

Huemoeller et al., U.S. Appl. No. 11/527,827, filed Sep. 26, 2006, entitled "Semiconductor Package and Substrate Having Multi-Level Vias Fabrication Method".

Huemoeller et al., U.S. Appl. No. 11/543,540, filed Oct. 4, 2006, entitled "Method and Structure for Creating Embedded Metal Features".

Rusli et al., U.S. Appl. No. 11/621,402, filed Jan. 9, 2007, entitled "Embedded Circuit Pattern Fabrication Method and Structure".

* cited by examiner

METHOD FOR MAKING AN INTEGRATED CIRCUIT SUBSTRATE HAVING EMBEDDED BACK-SIDE ACCESS CONDUCTORS AND VIAS

CROSS-REFERENCE TO RELATED APPLICATIONS

The present application is a divisional of U.S. patent application Ser. No. 10/392,737 entitled "INTEGRATED CIRCUIT SUBSTRATE HAVING EMBEDDED BACK-SIDE ACCESS CONDUCTORS AND VIAS" filed on Mar. 19, 2003 now abandoned, which is a Continuation-in-Part of U.S. patent application entitled "INTEGRATED CIRCUIT FILM SUBSTRATE HAVING EMBEDDED CONDUCTIVE PATTERNS AND VIAS", Ser. No. 10/261,868 filed Oct. 1, 2002 now abandoned and having at least one common inventor and assigned to the same assignee. Ser. No. 10/392,737 is also a Continuation-in-Part of U.S. patent application entitled "INTEGRATED CIRCUIT SUBSTRATE HAVING LASER-EMBEDDED CONDUCTIVE PATTERNS AND METHOD THEREFOR", Ser. No. 10/138,225 filed May 1, 2002 now U.S. Pat. No. 6,930,256, by the same inventors and assigned to the same assignee. The specifications of the above-referenced patent applications are herein incorporated by reference.

FIELD OF THE INVENTION

The present invention relates generally to semiconductor packaging, and more specifically, to a substrate having laser generated embedded back-side access conductors for providing electrical connection within an integrated circuit package.

BACKGROUND OF THE INVENTION

Semiconductors and other electronic and opto-electronic assemblies are fabricated in groups on a wafer. Known as "dies", the individual devices are cut from the wafer and are then bonded to a carrier. The dies must be mechanically mounted and electrically connected to a circuit. For this purpose, many types of packaging have been developed, including "flip-chip", ball grid array and leaded grid array among other mounting configurations. These configurations typically use a planar printed circuit etched on the substrate with bonding pads and the connections to the die are made by either wire bonding or direct solder connection to the die.

The resolution of the printed circuit is often the limiting factor controlling interconnect density. Photo-etch and other processes for developing a printed circuit on a substrate have resolution limitations and associated cost limitations that set the level of interconnect density at a level that is less than desirable for interfacing to present integrated circuit dies that may have hundreds of external connections.

As the density of circuit traces interfacing an integrated circuit die are increased, the inter-conductor spacing must typically be decreased. However, reducing inter-conductor spacing has a disadvantage that migration and shorting may occur more frequently for lowered inter-conductor spacings, thus setting another practical limit on the interconnect density.

The above-incorporated patent applications provide improvements increasing conductor density and decreasing conductor spacings via laser-embedded circuit technologies, but are generally stand-alone rigid substrate or film substrate technologies replacing the traditional etched, printed or plated substrate technologies. Etched, printed and plated technologies provide cost advantages in that processes are well-established and volume parts can be purchased from vendors producing high volume parts using the traditional technologies.

Therefore, it would be desirable to provide a method and substrate having improved interconnect density with a low associated manufacturing cost. It would further be desirable to provide a method and substrate incorporating laser-embedded circuits, while retaining compatibility with and the advantages of etched, printed or plated substrates.

SUMMARY OF THE INVENTION

The above objectives of providing improved interconnect density and a low associated manufacturing cost and providing improvements associated with laser-embedded circuit in a technology compatible with etched, printed or plated technology are provided in a substrate and method for manufacturing a substrate. The method produces the substrate by generating connections to existing circuit material on (or within) a prefabricated substrate by generating blind vias and/or embedding conductors from a back side of the prefabricated substrate. A laser is used to perforate the substrate and conductive material is either plated/etched or screened through the perforations, yielding a low-cost double sided substrate.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figure 1A:
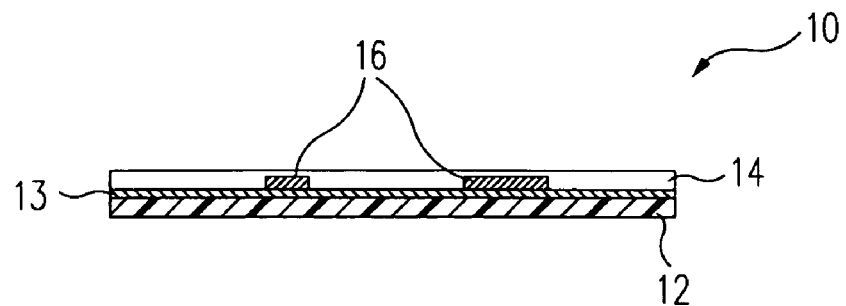
FIGS. 1A and 1B are pictorial diagrams depicting a cross-sectional view and a top view of an initial substrate layer as prepared for use in an embodiment of the present invention.
Figure 1B:
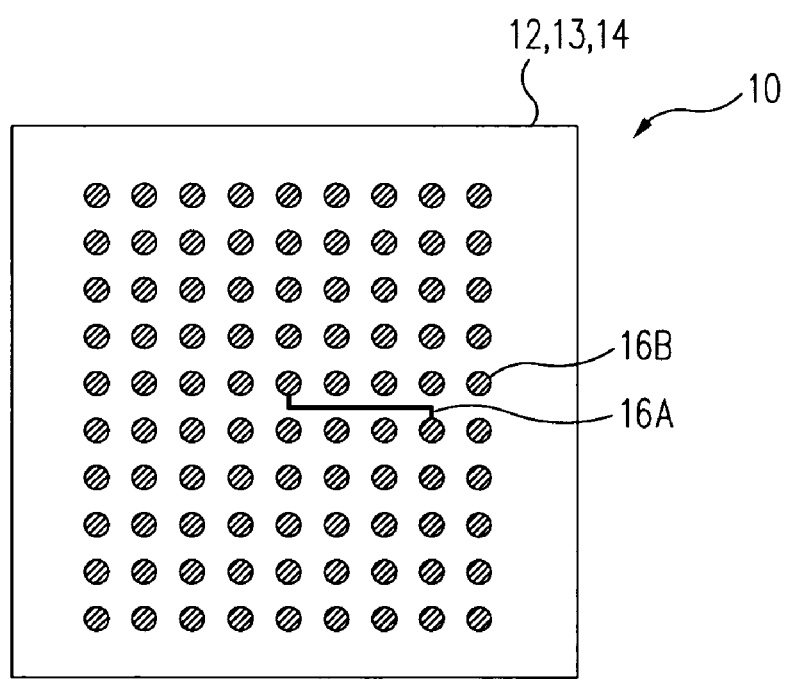

Referring now to the figures and in particular to FIGS. 1A and 1B, a cross-sectional view and a top view of a substrate 10, having a dielectric layer 12, a conductive circuit pattern 16 and a solder mask 14 deposited over conductive circuit pattern 16. An adhesive layer 13 may be present, particularly for film substrates such as polyimide film. Substrate 10 may be fabricated from a dielectric film tape such as a polyimide film having etched, printed or plated metal conductors forming circuit pattern 16, in accordance with one embodiment of the present invention. Alternatively, substrate 10 may be fabricated from a rigid or semi-rigid dielectric layer 12 such as polyimide resin having etched, printed-or plated metal conductors forming circuit pattern 16, in accordance with another embodiment of the present invention. Suitable tape materials are KAPTON, APICAL, UPILEX and various liquid crystal polymers (LCPs) may also be used to form the core of the substrate of the present invention. Rigid substrate layers may be cured epoxy resin, FR4, or other substrate materials commonly used to form integrated circuit substrates.

The present invention provides a low-cost alternative to the techniques described in the above-incorporated patent applications by modifying the low-cost substrate 10 of FIGS. 1A and 1B to form a double-sided or multi-layer substrate. One application is depicted in FIG. 1B, wherein a ball grid array (BGA) land 16B pattern is etched, printed or plated on suitable dielectric layer 12 and the techniques of the present invention are used to make connection to the backside of BGA lands 16B through dielectric layer 12. Circuit trace 16A is provided to illustrate that substrate 10 may also include interconnect patterns on the top side as well as lands. Other embodiments of substrate 10 may include interconnect-only configurations, et cetera. The present invention provides a method and structure that provide back-side connection to any type of single-sided circuit provided on the top side of substrate 10.

Figure 2A:
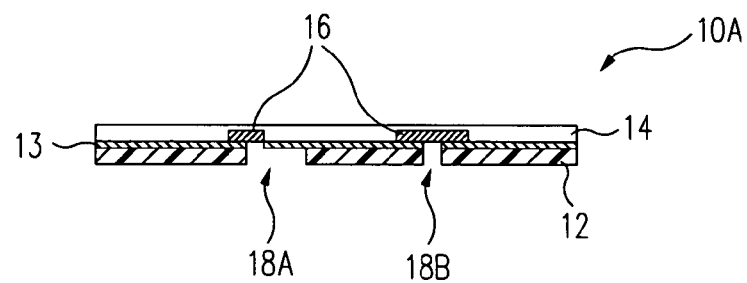
FIGS. 2A-2C and 3A-3C are a pictorial diagrams depicting a cross-sectional view of the stages of preparation of a substrate in accordance with an embodiment of the present invention.

Referring now to FIG. 2A, a first stage of preparation of substrate 10 to form a substrate 10A is illustrated. Apertures 18A and 18B are laser-ablated through dielectric layer 12 and adhesive layer 13 (if present) to form blind vias (aperture 18B) and/or circuit channels (aperture) 18A. Circuit channels may be formed by laser-ablating through adhesive layer 13, or alternatively, circuit channels may be laser ablated only in the dielectric layer 12 (with blind via portions laser-ablated through adhesive layer 13 in order to make contact with circuit pattern 16). Also, circuit channels may be laser-ablated to have a top side contacting adhesive layer (i.e., laser-ablating through dielectric layer 12 to form contact with adhesive layer 13 to provide improved adhesion of metal that is later deposited in the channels). Aperture 18A illustrates a circuit channel over and connecting with a blind via aperture that is laser-ablated to provide such contact with adhesive layer 13.

Figure 2B:
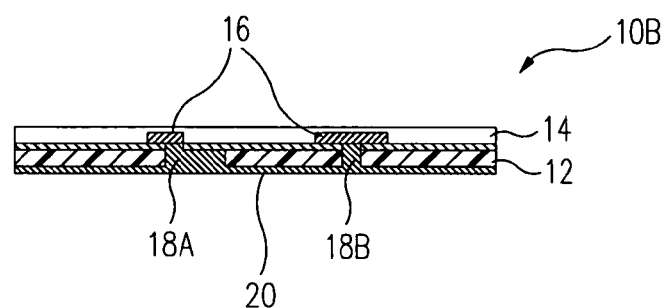

Referring now to FIG. 2B, a second stage of preparation of substrate 10A to form a substrate 10B is illustrated. Metal 20 is plated over the bottom side of dielectric layer 12, filling apertures 18A and 18B with conductor. Alternatively, conductive paste may be screened over apertures 18A and 18B and cured to fill apertures 18A and 18B with conductor.

Figure 2C:
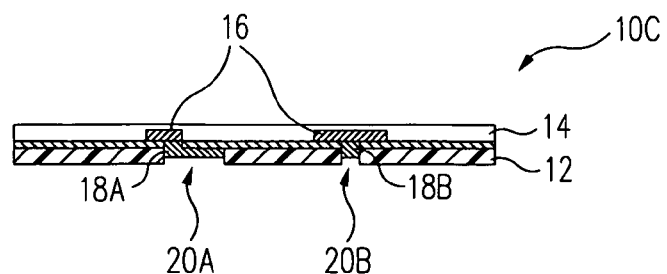

Referring now to FIG. 2C, a third stage of preparation of substrate 10B to form a substrate 10C is illustrated. Metal 20 is selectively etched away (or milled away) from the bottom side of dielectric layer 12, leaving circuit pattern metal 20A and 20B, providing blind via electrical connection to circuit patterns 16. If conductive paste screened metal is used to generate metal 20 layer, then a buffing/sanding process is used to remove excess paste leaving circuit pattern metal 20A and 20B.

Figure 3A:
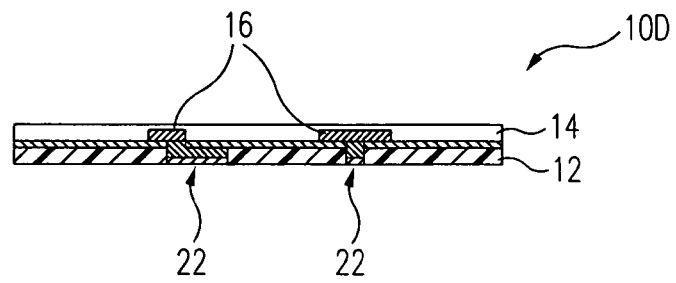

Next, referring to FIG. 3A, a fourth stage of preparation of substrate 10C to form a substrate 10D is illustrated. A plating 22 (generally Nickel/Gold) is plated on circuit pattern metal 20A and 20B, providing a surface for wire bonding or other die connection. Plating 22 is optional where not required, for example in flip-chip solder ball attach die-attach technologies.

Figure 3B:
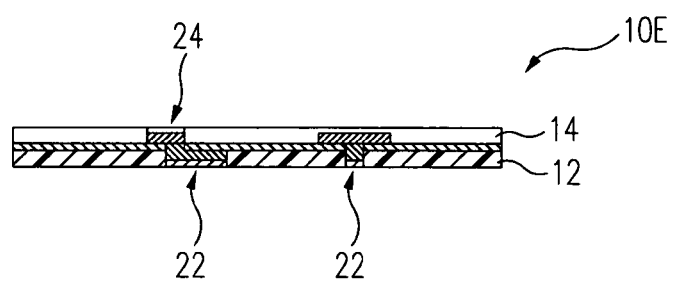

Then, referring to FIG. 3B, a fifth stage of preperation of substrate 10D to form a substrate 10E is illustrated. Solder mask 14 is laser-ablated to expose BGA lands 24 providing top side access to circuit pattern 16.

Figure 3C:
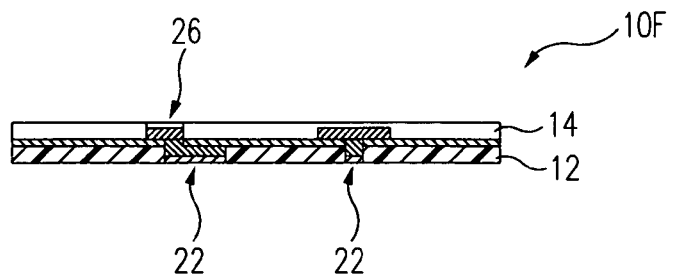

Finally, reffering to FIG. 3C, a sixth stage of preperation of substrate 10E to form a substrate 10F is illustrated. A gold-safe OSP layer 26 is deposited on BGA lands 24 for solder ball attached.

Because apertures 18A and 18B can be made to any depth, conductive patterns in accordance with the techniques disclosed in the above-incorporated patent application may be integrated on the back side (bottom side) of substrate 10F, providing a very high-density interconnect on one side of a prefabricated low-cost substrate 10. Blind vias and conductive patterns can be integrated for connection to circuit patterns 16, including semiconductor package terminals such as BGA lands 16B.

Figure 4A:
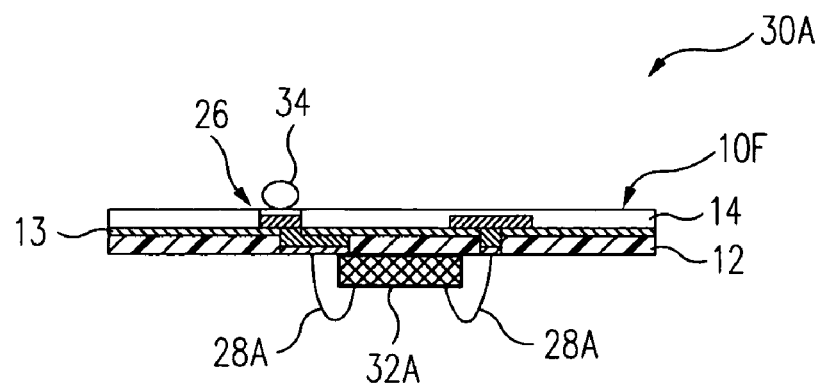
FIGS. 4A and 4B are pictorial diagrams depicting integrated circuits in accordance with embodiments of the present invention.

Referring now to FIG. 4A, an integrated circuit 30A in accordance with an embodiment of the present invention is depicted. An integrated circuit die 32A is attached to substrate 10F using a bonding agent such as epoxy. While die 32A is depicted as mounted above substrate 10F, a die mounting recess may also be laser-ablated or otherwise provided in substrate 10F, reducing the package height, as the circuit pattern formed by channels 20A may be made at any depth. Electrical interconnects 28A (wires) from die 32A are wire bonded to the circuit pattern on the bottom side of substrate 10F electrically connecting die 32A to channel circuit patterns 20A and vias 20B. External terminals 34, depicted as solder balls, are attached to BGA lands 26, providing a complete integrated circuit that may be encapsulated.

Figure 4B:
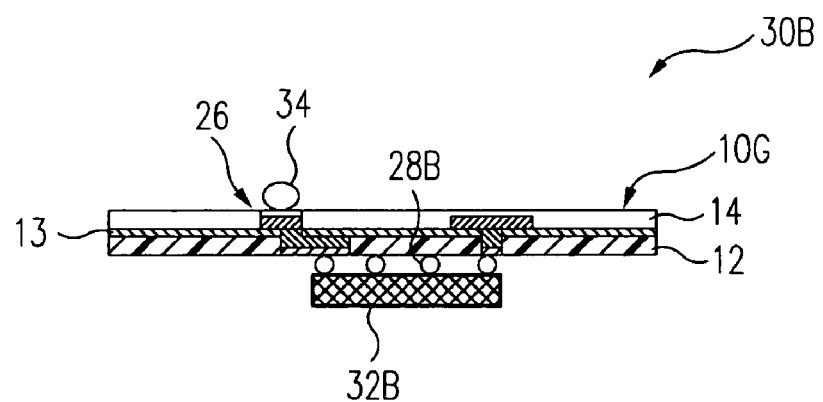

Referring now to FIG. 4B, an integrated circuit 30B in accordance with an alternative embodiment of the invention is depicted. Die 32B is a "flip-chip" die that is directly bonded to a substrate 10G via solder balls 28B. External solder ball terminals 34 are provided as in the embodiment of FIG. 3A. Substrate 10G is fabricated in the same manner as substrate 10F, but may have a differing configuration to support the flip-chip die 32B interconnect.

The above description of embodiments of the invention is intended to be illustrative and not limiting. Other embodiments of this invention will be obvious to those skilled in the art in view of the above disclosure and fall within the scope of the present invention.

What is claimed is:

1. A method for manufacturing an integrated circuit substrate for interconnecting a semiconductor die, comprising:

mounting a prefabricated dielectric layer having a first conductive pattern disposed on a first side thereof in a laser drilling machine, the prefabricated dielectric layer having a second side opposing the first side and wherein the prefabricated dielectric layer further comprises a dielectric and an adhesive layer having the first conductive pattern formed on a top side thereof;

laser-drilling a plurality of perforations comprising channels and blind via apertures from the second side of the prefabricated dielectric layer, the blind via apertures extending through to a back side of the first conductive pattern, the channels extending through the dielectric only and to the adhesive such that the adhesive remains between the channels and the first conductive pattern; and depositing metal through the perforations to form blind vias to the first conductive pattern from the second side of the prefabricated dielectric layer, wherein the depositing forms a second conductive pattern on the second side of the prefabricated dielectric layer.

2. The method of claim 1, wherein the depositing metal deposits metal filling the perforations and covering the second side of the prefabricated dielectric layer and further comprising etching the deposited metal to form the second conductive pattern on the second side of the prefabricated dielectric layer.

3. The method of claim 2, wherein the prefabricated dielectric layer further comprises a solder mask completely covering the first conductive pattern, and further comprising laser ablating the solder mask from the first side of the prefabricated dielectric layer to expose areas of the first conductive pattern.

4. The method of claim 1, wherein the prefabricated dielectric layer is a tape having the first conductive pattern formed on a top side thereof, and wherein the laser-drilling forms perforations through the tape to the first conductive pattern.

5. The method of claim 1, wherein the prefabricated dielectric layer is a rigid dielectric having the first conductive pattern formed on a top side thereof, and wherein the laser-drilling forms perforations through the rigid dielectric to the first conductive pattern.

6. The method of claim 1, wherein the depositing metal deposits metal filling the perforations and covering the second side of the prefabricated dielectric layer and further comprising etching the deposited metal so that ends of the blind vias on the second side of the prefabricated dielectric layer are exposed.

7. The method of claim 1, wherein the depositing metal plates metal filling the perforations and covering the second side of the prefabricated dielectric layer and further comprising etching the deposited metal to form the second conductive pattern on the second side of the prefabricated dielectric layer.

8. The method of claim 1, wherein the depositing metal deposits metal filling the perforations and covering the second side of the prefabricated dielectric layer and further comprising abrading the deposited metal so that ends of the blind vias on the second side of the prefabricated dielectric layer are exposed.

9. The method of claim 1, wherein the prefabricated dielectric layer further comprises a solder mask completely covering the first conductive pattern, and further comprising laser ablating the solder mask from the first side of the prefabricated dielectric layer to expose areas of the first conductive pattern.

10. The method of claim 1, further comprising prior to the mounting, prefabricating the prefabricated dielectric layer by plating the first conductive pattern on the first side thereof.

11. The method of claim 1, further comprising prior to the mounting, prefabricating the prefabricated dielectric layer by printing the first conductive pattern on the first side thereof.

12. The method of claim 1, wherein the prefabricated dielectric layer includes a metal layer disposed on the first side thereof and further comprising prior to the mounting, etching the metal layer to form the first conductive pattern.

13. The method of claim 1, further comprising plating ends of the blind vias.

14. The method of claim 1 wherein the channels connect with the blind via apertures.

15. The method of claim 1 wherein the blind vias are formed in the blind via apertures and wherein the second conductive pattern is formed in the channels.

16. A method for manufacturing an integrated circuit package, the method comprising:
mounting a prefabricated dielectric layer having a first conductive pattern disposed on a first side thereof in a laser drilling machine, the prefabricated dielectric layer having a second side opposing the first side and wherein the prefabricated dielectric layer further comprises a dielectric and an adhesive layer having the first conductive pattern formed on a top side thereof;
laser-drilling a plurality of perforations comprising channels and blind via apertures from the second side of the prefabricated dielectric layer, the blind via apertures extending through to a back side of the first conductive pattern, the channels extending through the dielectric only and to the adhesive such that the adhesive remains between the channels and the first conductive pattern;
depositing metal through the perforations to form blind vias to the first conductive pattern from the second side of the prefabricated dielectric layer, wherein the depositing forms a second conductive pattern on the second side of the prefabricated dielectric layer;
mounting a semiconductor die to the first side of the prefabricated dielectric layer; and
connecting electrical terminals of the semiconductor die to the first conductive pattern.

17. The method of claim 16, wherein the prefabricated dielectric layer is a tape having the first conductive pattern formed on a top side thereof, and wherein the laser-drilling forms perforations through the tape to the first conductive pattern.

18. The method of claim 16, wherein the prefabricated dielectric layer is a rigid dielectric having the first conductive pattern formed on a top side thereof, and wherein the laser-drilling forms perforations through the rigid dielectric to the first conductive pattern.

19. A method for manufacturing an integrated circuit package, the method comprising:
mounting a prefabricated dielectric layer having a first conductive pattern attached by an adhesive layer to a dielectric on a first side thereof in a laser drilling machine, the prefabricated dielectric layer having a second side opposing the first side;
laser-drilling a plurality of perforations comprising channels and blind via apertures from the second side of the prefabricated dielectric layer, the blind via apertures extending through the adhesive layer to a back side of the first conductive pattern, the channels extending through the dielectric only and to the adhesive such that the adhesive remains between the channels and the first conductive pattern;
depositing metal through the perforations to form blind vias to the first conductive pattern from the second side of the prefabricated dielectric layer and a second conductive pattern in contact with the adhesive layer;
mounting a semiconductor die to the first side of the prefabricated dielectric layer; and
connecting electrical terminals of the semiconductor die to the first conductive pattern.

20. The method of claim 19 wherein the channels connect with the blind via apertures.

* * * * *